(12) United States Patent
Mikata

(10) Patent No.: US 6,329,303 B1
(45) Date of Patent: Dec. 11, 2001

(54) THIN FILM FORMING METHOD, THIN FILM FORMING APPARATUS AND METHOD FOR MANUFACTURING SEMICONDUCTOR DEVICE

(75) Inventor: Yuuichi Mikata, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/260,501

(22) Filed: Mar. 2, 1999

(30) Foreign Application Priority Data

Mar. 4, 1998 (JP) .................................. 10-052163

(51) Int. Cl.$^7$ .......................... H01L 21/31; H01L 21/469
(52) U.S. Cl. ............................. 438/785; 438/765
(58) Field of Search ................................. 438/197, 762, 438/763, 765, 785, 96, 166, 906, 507

(56) References Cited

U.S. PATENT DOCUMENTS 5,232,868 * 8/1993 Hayashi et al. ........................ 438/96
5,618,761 * 4/1997 Eguchi et al. ........................ 438/785
5,637,512 * 6/1997 Miyassaka et al. .................. 438/166
6,254,933 * 7/2001 Habuka et al. .................... 327/248.1

FOREIGN PATENT DOCUMENTS 9-275076  10/1997  (JP) .

\* cited by examiner

*Primary Examiner*—David Nelms
*Assistant Examiner*—Phuc T. Dang
(74) *Attorney, Agent, or Firm*—Finnegan, Henderson, Farabow, Garrett & Dunner, L.L.P.

(57) ABSTRACT

Disclosed is a method of forming a thin film on a substrate surface by a CVD method, including the steps of arranging a substrate such that one main surface of the substrate is exposed to a closed space, and decomposing by heating a raw material gas filling the closed space so as to form a thin film containing at least one element constituting the raw material gas on the main surface of the substrate, the raw material gas containing a gas component generated by heating a material, which is solid or liquid at room temperature, arranged within the closed space.

20 Claims, 2 Drawing Sheets

THIN FILM FORMING METHOD, THIN FILM FORMING APPARATUS AND METHOD FOR MANUFACTURING SEMICONDUCTOR DEVICE

BACKGROUND OF THE INVENTION

The present invention relates to a method and apparatus for forming a thin film by a CVD method and a method of manufacturing a semiconductor device comprising the step of forming a thin film by a CVD method.

With progress in the degree of integration of a DRAM, it is of high importance to decrease the thickness of a capacitor insulating film. In the case of using the conventional material for forming a capacitor insulating film, the capacitor insulating film must be formed very thin in order to obtain a sufficient electrostatic capacitance. Therefore, it is proposed in recent years to use a material having a high dielectric constant such as BaSrTi oxide (hereinafter referred to as "BSTO") for forming a capacitor insulating film.

In forming a BSTO thin film on a semiconductor substrate by a CVD method, it is ideal to use as a Ba source and a Sr source materials having a high vapor pressure and gaseous at room temperature. However, such a Ba source and a Sr source are unknown. Therefore, materials solid at room temperature and sublimated to form a gaseous phase when heated to a predetermined temperature are used as the Ba source and Sr source, said materials including, for example, bis(2,2,6,6-tetramethyl-3,5-heptanedionate)barium (hereinafter referred to as "$Ba(THD)_2$"), and bis(2,2,6,6-tetramethyl-3,5-heptanedionate)strontium (hereinafter referred to as "$Sr(THD)_2$"). Also, bis(2,2,6,6-tetramethyl-3,5-heptanedionate)titanium oxide (hereinafter referred to as "$TiO(THD)_2$") was used as a Ti source. Incidentally, $TiO(THD)_2$ is solid at room temperature and sublimated when heated.

FIG. 1 schematically shows a conventional CVD apparatus used for forming a BSTO thin film. In the conventional method, a solid $Ba(THD)_2$ 16 housed in a container 7 is heated by a heater 25 to 215° C. so as to be sublimated to generate a $Ba(THD)_2$ gas. A nitrogen gas is supplied as a carrier gas from a nitrogen gas supply source 14 into the container 7. The flow rate of the nitrogen gas into the container 7 is controlled by a mass flow controller 22. It follows that the $Ba(THD)_2$ gas and the nitrogen gas within the container 7 are supplied together into a chamber 1 through a valve 6.

A $Sr(THD)_2$ gas and a $TiO(THD)_2$ gas are also supplied similarly into the chamber 1. To be more specific, a solid $Sr(THD)_2$ 17 housed in a container 20 and a solid $TiO(THD)_2$ 18 housed in a container 19 are heated to 215° C. and 130° C., respectively, so as to generate a $Sr(THD)_2$ gas and a $TiO(THD)_2$ gas. Also, a nitrogen gas is supplied from a nitrogen gas source 14 into the containers 20 and 19 through mass flow controllers 21, 23, respectively. Naturally, the $Sr(THD)_2$ gas and the $TiO(THD)_2$ gas are supplied together with the nitrogen gas from the containers 20 and 19 into the chamber 1 through valves. Further, an oxygen gas is supplied from an oxygen gas supply source 15 into the chamber 1 through a mass flow controller 24.

The $Ba(THD)_2$ gas, $Sr(THD)_2$ gas, $TiO(THD)_2$ gas, oxygen gas and nitrogen gas are mixed within the chamber 1 to form a gas stream 5 within the chamber 1. The gas pressure within the chamber 1 is monitored by a pressure gauge 13 and controlled at about 10 Torr by a conductance valve 12 for pressure control.

A wafer 2 and a susceptor 8 within the chamber 1 are heated to about 600° C. by the light emitted from a lamp 3 and transmitted through the quartz wall of the chamber 1. As a result, the mixed gas within the chamber 1 is partially decomposed, and the decomposed materials carry out reactions. The reaction product is deposited on the wafer 2 to form a BSTO thin film.

A stagnant layer 4 through which a gas does not flow is formed in the vicinity of the surface of the wafer 2 during formation of the BSTO thin film. The mixed gas forming the gas stream 5 is partly supplied into the stagnant layer 4. The mixed gas supplied into the stagnant layer 4 is diffused within the stagnant layer 4 so as to reach the wafer surface. As a result, the raw material gas components contained in the mixed gas are decomposed so as to bring about deposition of BSTO.

As described above, the stagnant layer 4 contributes to the deposition of BSTO. Therefore, in order to form a BSTO thin film of a uniform thickness, it is necessary to control highly accurately the thickness, etc. of the stagnant layer 4 and, thus, to make the deposition rate uniform.

However, the thickness of the stagnant layer 4 tends to be affected by the gas stream 5. Also, it is very difficult to keep the gas stream 5 constant and uniform, leading to a non-uniform supply of the raw material gas components onto the wafer surface and to non-uniform deposition rate. It follows that it is difficult to form a BSTO thin film of a uniform thickness.

It should also be noted that the amount of the raw material gas components supplied from the gas stream 5 into the stagnant layer 4 is dependent in general on the partial pressure of the raw material gas components contained in the mixed gas forming the gas stream 5. Under the conditions described above, the amount of the raw material gas components supplied into the stagnant layer 4 is only several percent of the raw material gas components contained in the mixed gas forming the gas stream 5. In other words, the amount of the raw material gas components which are decomposed and consumed for the formation of the BSTO thin film is only several percent of all the raw material gas components supplied to the chamber 1. Naturally, a major portion of the raw material gas components supplied to the chamber 1 is not decomposed so as to be discharged to the outside of the apparatus through a main valve 9, a conductance valve 12 for the pressure control, a pipe 11 and a pump 10, leading to a markedly high manufacturing cost of a semiconductor device including a BSTO thin film.

It should also be noted that the $Ba(THD)_2$ gas, $Sr(THD)_2$ gas and $TiO(THD)_2$ gas used in the conventional method are prepared by sublimation of the solid raw materials 16 to 18. This makes it necessary to heat the pipe, valve, etc. connected to the chamber 1 so as to prevent the $Ba(THD)_2$ gas, etc. from being solidified. However, the valve, etc. used in the CVD apparatus tends to bring about deterioration of the driving section when the valve is exposed to high temperatures. It follows that the valve, etc. must be renewed frequently.

In order to suppress the deterioration, it is necessary to set the heating temperature of the pipe, valve, etc. at a low level. If the heating temperature is lowered, however, the flow rate of the raw material gas components must be maintained at a low level in order to prevent the raw material gas components from being solidified.

BRIEF SUMMARY OF THE INVENTION

An object of the present invention is to provide a method and apparatus for forming a thin film and a method of manufacturing a semiconductor device wherein a film of a uniform thickness can be formed.

Another object is to provide a method and apparatus for forming a thin film and a method of manufacturing a semiconductor device wherein a thin film can be formed at a low cost.

Still another object of the present invention is to provide a method and apparatus for forming a thin film and a method of manufacturing a semiconductor device wherein a thin film can be formed under higher temperature conditions without renewing frequently the constituent members of the apparatus.

According to an aspect of the present invention, there is provided a method of forming a thin film on a substrate surface by a CVD method, comprising the steps of arranging a substrate such that one main surface of the substrate is exposed to a closed space, and decomposing by heating a raw material gas filling the closed space so as to form a thin film containing at least one element constituting the raw material gas on the main surface of the substrate, the raw material gas containing a gas component generated by heating a material, which is solid or liquid at room temperature, arranged within the closed space.

According to another aspect of the present invention, there is provided a method of manufacturing a semiconductor device, comprising the step of forming a thin film on a semiconductor substrate by a CVD method, the step including the sub-steps of arranging a semiconductor substrate such that one main surface of the substrate is exposed to a closed space, and decomposing by heating a raw material gas filling the closed space so as to form a thin film containing at least one element constituting the raw material gas on the main surface of the semiconductor substrate, the raw material gas containing a gas component generated by heating a material, which is solid or liquid at room temperature, arranged within the closed space.

Further, according to still another aspect of the present invention, there is provided an apparatus for forming a thin film on a substrate surface by a CVD method, comprising a substrate holding means for holding a substrate, a reaction vessel forming a closed space to which one main surface of the substrate is exposed, a material holding means arranged inside the reaction vessel for holding a solid or liquid material, and a heating means mounted on the side of the other main surface of the substrate for heating the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of t e invention.

DETAILED DESCRIPTION OF THE INVENTION

Let us describe the present invention more in detail with reference to the accompanying drawings.

Figure 1:
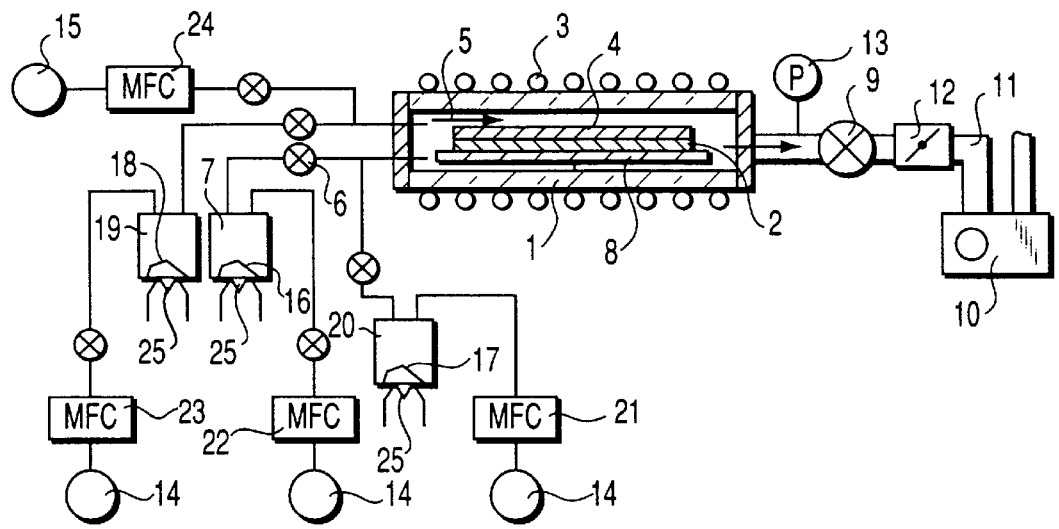
FIG. 1 schematically shows a conventional CVD apparatus.
Figure 2:
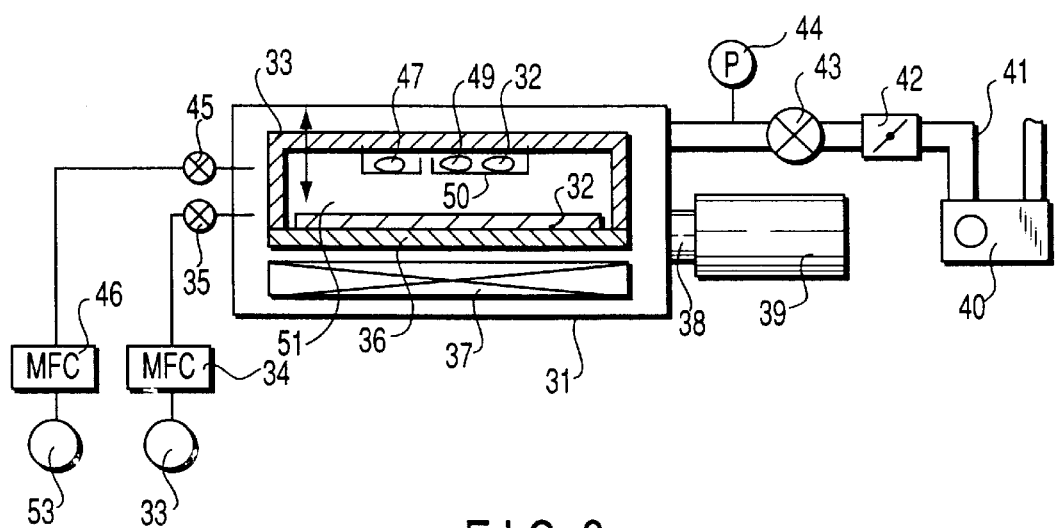
FIG. 2 schematically shows a thin film forming apparatus according to first and third embodiments of the present invention.

Specifically, FIG. 2 schematically shows a thin film forming apparatus according to first and third embodiments of the present invention.

In the first embodiment of the present invention, the apparatus shown in FIG. 2 is used for film formation in which a part of the raw material gas components is generated from a solid material. As shown in the drawing, the apparatus includes a reaction furnace 31. A front chamber 39 is connected to the reaction furnace 31 via a gate valve 38. A substrate 32 such as a semiconductor wafer is supplied from the front chamber 39 into the reaction furnace 31.

Arranged within the reaction furnace 31 are a susceptor 36, a heater 37 and a reaction vessel 33. The wafer 32 transferred from the front chamber 39 into the reaction furnace 31 is supported by the susceptor 36, and the wafer 32 is heated by the heater 37 via the susceptor 36. The reaction vessel 33 is movable relative to the susceptor 36. Where, for example, the wafer 32 is disposed on the susceptor 36, the reaction vessel 33 is moved to a position away from the susceptor 36. On the other hand, the reaction vessel 33 is moved for the film forming operation such that the peripheral portion of the reaction vessel 33 is brought into contact with the susceptor 36 so as to form a closed space 51.

A container 50 acting as a material holding means for holding a material generating a reactant gas, i.e., raw gas component is arranged inside the reaction vessel 33. The material holding means is not particularly limited as far as the material holding means is capable of holding the material generating the reactant gas and is shaped to permit the generated reactant gas to be diffused within the closed space 51. The reactant gas generating material used in this embodiment is solid at room temperature and generates a gas when heated to a predetermined temperature. It follows that a plate-like body can be used in this embodiment as the material holding means.

An oxygen gas supply source 52 and a nitrogen gas supply source 53 are connected to the reaction furnace 31. A mass flow controller 34 and a valve 35 are mounted to the pipe connecting the oxygen gas supply source 52 to the reaction furnace 31. Likewise, a mass flow controller 46 and a valve 45 are mounted to the pipe connecting the nitrogen gas supply source 53 to the reaction furnace 31.

A pipe 41 is connected at one end to the reaction furnace 31 and at the other end to a pump 40. Further, a pressure gauge 44, a valve 43 and a conductance valve 42 are mounted to the pipe 44 in the order mentioned when viewed from the reaction furnace 31.

The apparatus shown in FIG. 2 is used for forming, for example, a BSTO thin film. In forming a BSTO thin film, the pressure within the front chamber 39 housing the semiconductor wafer 32 is reduced to $10^{-2}$ Torr or less. Then, the gate valve 38 is opened to transfer the wafer 32 from the front chamber 39 into the reaction furnace 31 having the inner pressure reduced in advance to $10^{-2}$ Torr or less. The wafer 32 transferred into the reaction furnace 31 is disposed on the susceptor 36. In this step, the reaction vessel 33 is positioned away from the susceptor 36, and the temperature within the reaction furnace 31 is set at 300° C. or less. Also, the pump 40 is driven, and the valve 43 is opened so as to reduce in advance the inner pressure of the reaction furnace 31 to $10^{-2}$ Torr or less, as described above.

Then, the gate valve 38 is closed, and the valve 35 is opened to introduce an oxygen gas into the reaction furnace 31. In this step, the discharge power is controlled by the conductance valve 42 on the basis of the indication of the pressure gauge 44 so as to control the pressure within the reaction furnace 31 at 10 Torr.

Further, the reaction vessel 33 is moved to bring the periphery of the reaction vessel 33 into contact with the susceptor 36 so as to form the closed space 51. Under this condition, a nitrogen gas, which is an inert gas, is introduced into the reaction furnace 31 in place of the oxygen gas. To be more specific, the flow rate of the oxygen gas is lowered by using the mass flow controller 34 and, at the same time, the valve 45 is opened so as to supply a nitrogen gas from the nitrogen gas supply source 53 into the reaction furnace 31. The pressure within the reaction furnace 31 is maintained at 10 Torr by increasing the flow rate of the nitrogen gas by using the mass flow controller 46 in accordance with decrease in the oxygen gas flow rate. By the particular operation, the oxygen gas in the space within the reaction furnace 31 and outside the reaction chamber 33 is replaced by the nitrogen gas. On the other hand, the closed space 51 remains to be filled with the oxygen gas.

In the next step, the susceptor 36 is heated by the heater 37 to elevate the wafer temperature to about 600° C. In this step, solid materials 47 to 49 consisting of, for example, TiO(THD)$_2$, Ba(THD)$_2$ and Sr(THD)$_2$, respectively, which act as raw material gas sources, are arranged within the container 50. When the wafer 32 is heated, these solid materials 47 to 49 are heated to 300° C. or more by, for example, the heat radiation from the wafer 32, with the result that a TiO(THD)$_2$ gas, a Ba(THD)$_2$ gas and a Sr(THD)$_2$ gas are generated from these solid materials 47, 48 and 49, respectively.

These TiO(THD)$_2$ gas, Ba(THD)$_2$ gas and Sr(THD)$_2$ gas scarcely form a gas stream and are diffused uniformly within the closed space 51. It follows that a region producing a function equal to that produced by the stagnant layer formed in the conventional method is formed over the entire region of the closed space 51. The TiO(THD)$_2$ gas, Ba(THD)$_2$ gas, Sr(THD)$_2$ gas and oxygen gas within the closed space 51 are uniformly mixed and, then, decomposed on the wafer 32 so as to deposit BSTO on the wafer 32.

The wafer 32 was kept heated for one minute, followed by lowering the wafer temperature. At the same time, the reaction vessel 33 was moved away from the susceptor 36 so as to purge the gas within the closed space 51.

The BSTO thin film thus formed was found to have a uniform thickness of ±2%. In the first embodiment of the present invention, the raw material gas components do not form a gas stream and are diffused uniformly within the closed space 51, leading to the high uniformity in the thickness of the resultant BSTO thin film. In other words, if the raw material gas stream is non-uniform, the deposition rate is rendered nonuniform, resulting in failure to form a thin film of a uniform thickness.

It should also be noted that, in the first embodiment of the present invention, the raw material gas components are supplied to the stagnant layer at a high efficiency, compared with the conventional method. As a result, such a high film forming rate as about 200 Å/min was obtained in the first embodiment of the present invention.

Also, in the first embodiment of the present invention, all the raw material gas components were utilized for forming a stagnant layer, making it possible to form a BSTO thin film at a low cost, compared with the conventional method.

Also, in the first embodiment of the present invention, the solid materials 47 to 49 providing the sources of the raw material gas components are sublimated within the closed space 51. In other words, the sublimation is carried out within the stagnant layer, making it unnecessary to heat the pipe, valve, etc. unlike the case where the evaporation is carried out at a position remote from a position where the stagnant layer is formed. Naturally, the valve, etc. are prevented from being deteriorated.

In the embodiment described above, a BSTO thin film was formed under the conditions of 10 Torr and 600° C. However, the BSTO thin film formation can be carried out under the pressure of 1 mTorr to 200 Torr and the temperature of 300° C. to 700° C. Also, the thin film formed by the method of the present invention is not limited to a BSTO film. Specifically, the method described above is applicable to formation of a thin film using a material which is solid in the vicinity of room temperature as a raw material gas source.

Figure 3A:
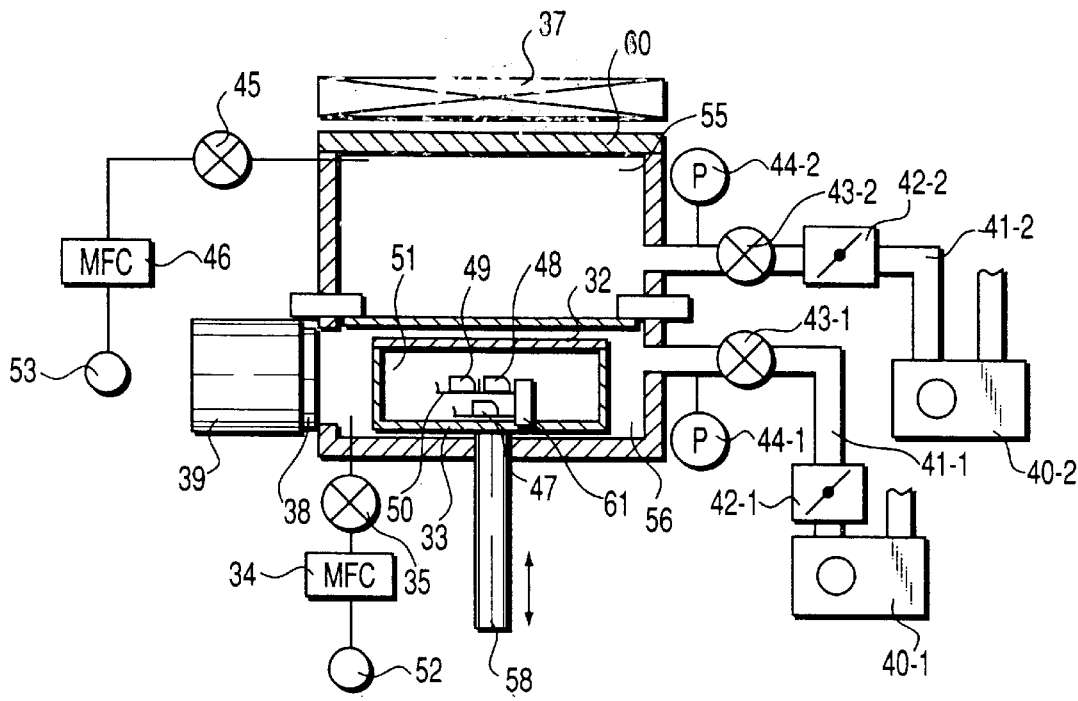
FIGS. 3A and 3B schematically show thin film forming apparatuses according to second and fourth embodiments, respectively, of the present invention.
Figure 3B:
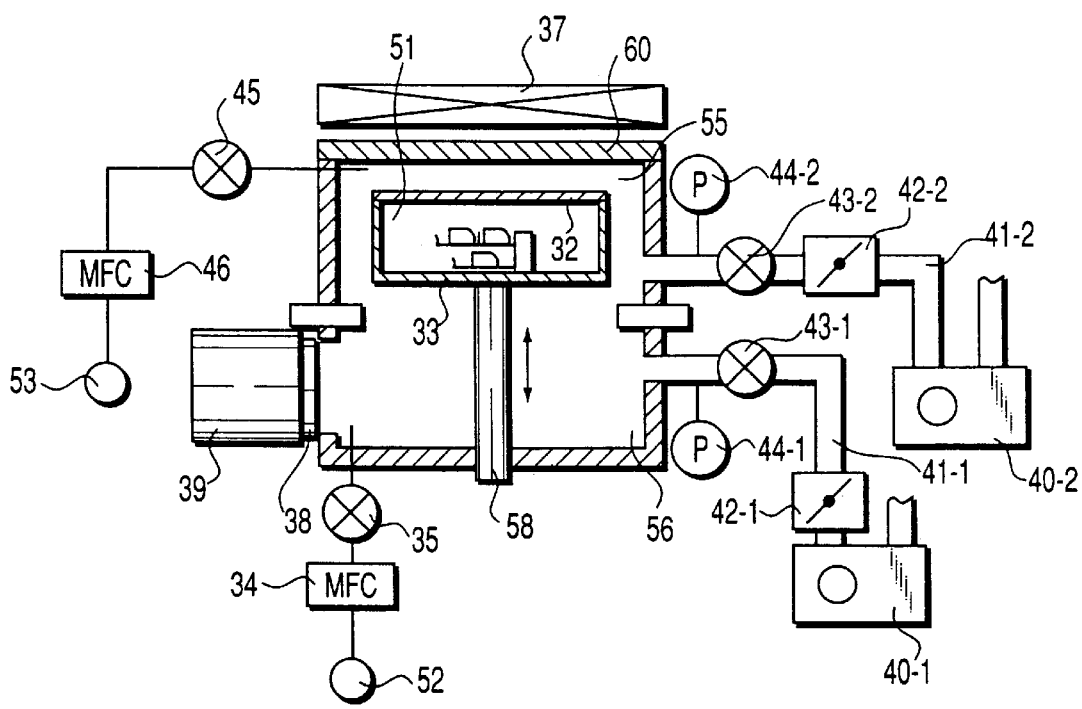

Let us describe a second embodiment of the present invention with reference to FIGS. 3A and 3B. A thin film forming apparatus differing from that used in the first embodiment is used in the second embodiment.

As shown in FIG. 3A, the thin film forming apparatus shown in FIG. 3A comprises a reaction chamber 55. A waiting chamber 56 is positioned adjacent to the reaction chamber 55 with a shutter 57 interposed therebetween. If the shutter 57 is opened, the reaction chamber 55 is allowed to communicate with the waiting chamber 56, as shown in FIG. 3B. A front chamber 39 is connected to the waiting chamber 56 via a gate valve 38. In the apparatus shown in FIG. 3A, a substrate 32 such as a semiconductor wafer is transferred from the front chamber 39 into the waiting chamber 56 and, then, into the reaction chamber 55.

A reaction vessel 33 supported by a shaft 58 is arranged within the waiting chamber 56. In the second embodiment, the inner diameter of the reaction vessel 33 is smaller than the diameter of the wafer 32 such that a closed space 51 is defined by the reaction vessel 33 and the wafer 32. Also, the reaction vessel 33 can be moved into the reaction chamber 55 by opening the shutter 57 and moving the shaft 58 upward, as shown in FIG. 3B.

An oxygen gas supply source 52 is connected to the waiting chamber 56. A mass flow controller 34 and a valve 35 are mounted to the pipe connecting the oxygen gas supply source 52 to the reaction chamber 31. Also, a pipe 41-1 is connected at one end to the waiting chamber 56 and to a pump 40-1 at the other end. Further, a pressure gauge 44-1, a valve 43-1 and a conductance valve 42-1 are mounted to the pipe 41-1 in the order mentioned as viewed from the waiting chamber 56.

A plurality of containers 50 are mounted within the reaction vessel 33 as holding means for holding the reactant gas generating material. The holding means is not particularly limited as far as the holding means is shaped to hold the reactant gas generating material and to diffuse the generated gas into the reaction vessel 33. The reactant gas generating material used in this embodiment is not particularly limited as far as the material is solid at room temperature and generates a gas when heated to temperatures higher than a predetermined temperature. Naturally, the reactant gas generating means used in this embodiment may be in the form of a plate.

Each of the containers 50 is mounted to a shaft 61. It is possible for the shaft 61 to be capable of moving, for example, each of these containers 50 in a vertical direction.

A nitrogen gas supply source 53 is connected to the reaction chamber 55. A mass flow controller 46 and a valve 45 are mounted to the pipe connecting the nitrogen gas supply source 53 to the reaction chamber 55. Also, a pipe 41-2 is connected at one end to the reaction chamber 55 and to a pump 40-2 at the other end. Further, a pressure gauge 44-2, a valve 43-2 and a conductance valve 42-2 are mounted to the pipe 41-2 in the order mentioned as viewed from the reaction chamber 55. It should be noted that a ceiling plate 60 of the reaction chamber 55 is formed of a material having a relatively high heat conductivity, with the result that the heat generated from a heater 37 can be conducted into the reaction chamber 55.

Let us describe how to form, for example, a BSTO thin film by the film forming method using the apparatus shown in FIG. 3A. In the first step, the front chamber 39 housing the semiconductor wafer 32 is evacuated by a pump (not shown) to a vacuum of $10^{-2}$ Torr or less. In this step, the pump 40-1 is driven and the valve 43-1 is opened so as to maintain the pressure within the waiting chamber 56 at a level equal to the inner pressure of the front chamber 39. Then, the gate valve 38 is opened so as to transfer the wafer 32 from the front chamber 39 into the waiting chamber 56. After transfer of the wafer 32 into the waiting chamber 56, the gate valve 38 is closed while maintaining the wafer 32 at a position remote from the reaction chamber 33 by a mechanism (not shown).

In the next step, the valve 35 is opened so as to introduce an oxygen gas into the waiting chamber 56. In this step, the pressure within the waiting chamber 56 is adjusted at 10 Torr by operating the conductance valve 42-1 based on the indication of the pressure gauge 44-1 so as to control the exhausting power. Then, the wafer 32 is disposed on the reaction vessel 33 so as to form the closed chamber 51. It should be noted that solid materials 47 to 49 of $TiO(THD)_2$, $Ba(THD)_2$ and $Sr(THD)_2$ are housed in advance in the containers 50 arranged within the reaction vessel 33.

Then, a nitrogen gas is supplied into the reaction chamber 55 at a flow rate of 1 slm, and the pressure within the reaction chamber 55 is set at 10 Torr by operating the conductance valve 42-2 based on the indication of the pressure gauge 44-2 so as to control the exhausting power. After the valves 35 and 43-1 are closed, the shutter 57 is opened as shown in FIG. 3B. As a result, a gas in the reaction chamber 55 and the waiting chamber 56 is substituted by a nitrogen gas. It should be noted that the closed space 51 is left filled with an oxygen gas in this step.

In the next step, the reaction vessel 33 is moved upward by the shaft 58 so as to permit the wafer 32 to approach the ceiling plate 60. The ceiling plate 60 is heated in advance to 900° C. by the heater 37. Therefore, the wafer 32 is heated by the heat radiation from the ceiling plate 60. It should also be noted that the solid materials 47 to 49 of $TiO(THD)_2$, $Ba(THD)_2$ and $Sr(THD)_2$ are also heated in accordance with the temperature elevation of the wafer 32. As a result, a $TiO(THD)_2$ gas, a $Ba(THD)_2$ gas and a $Sr(THD)_2$ gas are generated from these solid materials 47 to 49, respectively.

The temperatures of the wafer 32 and the solid materials 47 to 49 are dependent on the distances from the heat source. Naturally, the temperatures of the solid materials 47 to 49 are somewhat lower than the temperature of the wafer 32. In this embodiment, the distance between the ceiling plate 60 and the wafer 32 is controlled to set the wafer temperature at about 600° C. It should be noted that the solid material 47 generates a raw material gas component at a temperature lower than the temperatures at which the solid materials 48 and 49 generate raw material gas components. The distances of the solid materials 47 to 49 from the ceiling plate 60 are determined in view of the raw material gas generating temperatures noted above. To be more specific, the solid materials 48 and 49 are positioned closer to the heat source than the solid material 47 so as to set the temperature of the solid materials 48 and 49 at about 300° C. On the other hand, the solid material 47 is positioned to set the temperature thereof at about 200° C.

The $TiO(THD)_2$ gas, the $Ba(THD)_2$ gas and the $Sr(THD)_2$ gas thus generated scarcely form a gas stream and is diffused uniformly within the closed space 51. In other words, a region performing the function equal to that performed by the stagnant layer in the conventional method is formed in the entire region of the closed space 51.

The $TiO(THD)_2$ gas, the $Ba(THD)_2$ gas, the $Sr(THD)_2$ gas, and the oxygen gas within the closed space are mixed uniformly and, then, decomposed on the wafer 32 so as to deposit a BSTO film on the wafer 32.

The BSTO deposition was continued for one minute, followed by moving the reaction vessel 33 downward so as to lower the wafer temperature. Then, the shutter 57 was closed, and the wafer 32 was arranged at a position away from the reaction vessel 33 by using a mechanism (not shown). At the same time, the pump 40-1 was driven so as to purge the gas within the closed space 51, followed by taking the wafer 32 out of the apparatus.

The second embodiment described above also produces effects similar to those described previously in conjunction with the first embodiment. What should also be noted is that, in the second embodiment, the concentrations of the raw material gas components within the closed space can be controlled by controlling the distances between the solid materials 47 to 49 and the heater 37, making it possible to control highly accurately the composition of the BSTO thin film.

Incidentally, the nitrogen gas can be supplied into the closed space 51 through an axial bore formed in the shaft 58. Also, the film forming conditions can be changed in various fashions as in the first embodiment described previously.

Let us describe a third embodiment of the present invention. Third embodiment is substantially equal to the first embodiment, except that TEOS, which is liquid at room temperature, was used in place of the solid materials 47 to 49 and the wafer 32 was heated to 700° C. in the film forming step. In the third embodiment, a silicon oxide film having a uniformity of ±2% was formed at such a high film forming rate as about 1000 Å/min.

Let us describe a fourth embodiment of the present invention. The fourth embodiment is substantially equal to the second embodiment, except that TEOS, which is liquid at room temperature, was used in place of the solid materials 47 to 49, and the wafer 32 was heated to 700° C. in the film forming step. In the fourth embodiment, a silicon oxide film having a uniformity of ±2% was formed at such a high film forming rate as about 1000 Å/min. Also, the fourth embodiment was advantageous over the third embodiment in that TEOS was poured easily into the container 50.

In each of the first to fourth embodiments described above, the film thickness was controlled by controlling the film forming time. However, it is also possible to control the film thickness by controlling the supply amounts of the raw material gas components. Specifically, the amounts of the raw materials such as the oxygen gas, the solid materials 47 to 49, etc. required for forming a thin film of a desired thickness are calculated in advance. Also, the amounts of the raw materials such as the oxygen gas, the solid materials 47 to 49, etc. within the closed space 51 are made equal to the calculated amounts so as to permit these raw materials to be consumed completely in a single film formation. Under the particular condition, the film thickness reaches saturation in a certain time, making it possible to form a thin film of a desired thickness without relying on the film forming time.

As described above, a thin film is formed within a closed space in the present invention, and the raw material gas components are diffused uniformly within the closed space without forming a gas stream. It follows that the present invention makes it possible to form a thin film of a uniform thickness. What should also be noted is that the present invention permits supplying the raw material gas components to the stagnant layer at a higher efficiency than in the conventional method, leading to an improved film forming rate. Further, in the present invention, all the raw material gas components are utilized for formation of a stagnant layer. It follows that the present invention makes it possible to form a thin film at a low cost, compared with the conventional method. Still further, the sources of the raw material gas components are evaporated within a closed space in the present invention. To be more specific, the evaporation is carried out within the stagnant layer in the present invention. This makes it unnecessary to heat the pipe, valve, etc. in the present invention, unlike the prior art in which the evaporating position is apart from the forming position of the stagnant layer. Naturally, deterioration of the valve, etc. can be prevented in the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a thin film on a substrate surface by a CVD method, comprising the steps of:

arranging a substrate such that at least one main surface of said substrate is within a closed space; and decomposing by heating a raw material gas filling the closed space so as to form a thin film containing at least one element constituting the raw material gas on said main surface of the substrate, wherein said raw material gas contains a gas component generated by heating a solid or liquid material arranged within the closed space.

2. The method according to claim 1, wherein said raw material gas further contains a substance filling said closed space, said substance being gaseous at room temperature.

3. The method according to claim 1, wherein said raw material gas comprises a plurality of gas components generated by heating a plurality of materials which are solid or liquid at room temperature and arranged within said closed space.

4. The method according to claim 3, wherein the concentrations of said plural gas components filling said closed space are controlled by controlling the heating temperatures of said plural materials, respectively.

5. The method according to claim 4, wherein said temperature control is performed by controlling the distances between said plural materials and a heat source for heating the plural materials.

6. The method according to claim 1, wherein said step of arranging the substrate includes the arrangement of a reaction vessel having an open portion and the substrate such that the substrate covers the open portion of said reaction vessel to define the closed space.

7. A method of manufacturing a semiconductor device, comprising the step of forming a thin film on a semiconductor substrate by a CVD method, said step including the sub-steps of:

arranging a semiconductor substrate such that at least one main surface of said substrate is within a closed space; and decomposing by heating a raw material gas filling the closed space so as to form a thin film containing at least one element constituting the raw material gas on said main surface of the substrate, wherein said raw material gas contains a gas component generated by heating a solid or liquid material arranged within the closed space.

8. The method according to claim 7, wherein said raw material gas further contains a substance filling said closed space, said substance being gaseous at room temperature.

9. The method according to claim 7, wherein said raw material gas comprises a plurality of gas components generated by heating a plurality of materials which are solid or liquid at room temperature and arranged within said closed space.

10. The method according to claim 9, wherein the concentrations of said plural gas components filling said closed space are controlled by controlling the heating temperatures of said plural materials.

11. The method according to claim 10, wherein said temperature control is performed by controlling the distances between said plural materials and a heat source for heating the plural materials.

12. The method according to claim 7, wherein said step of arranging the substrate includes the arrangement of a reaction vessel having an open portion and the substrate such that the open portion of said reaction vessel is closed by the substrate and one main surface of the substrate constitutes a part of the boundary defining the closed space.

13. An apparatus for forming a thin film on a substrate surface by a CVD method, comprising:

a substrate holding means for holding a substrate;

a reaction vessel forming a closed space to which one main surface of said substrate is exposed;

a material holding means arranged inside said reaction vessel for holding a solid or liquid material, said material generating a gas component and said gas component comprising at least a part of a raw material gas for forming a thin film on said main surface of the substrate; and a heating means mounted on the side of the other main surface of said substrate for heating the substrate.

14. The apparatus according to claim 13, further comprising an exhausting means for exhausting the reaction vessel.

15. The apparatus according to claim 13, wherein said reaction vessel has an open portion, and one main surface of the substrate is positioned to constitute a part of the boundary defining said closed space.

16. The apparatus according to claim 13, further comprising a moving means for moving said substrate relative to said reaction vessel.

17. The apparatus according to claim 13, wherein said heating means heats said substrate on the other main surface of the substrate.

18. The apparatus according to claim 17, wherein said heating means heats a solid or liquid material held by said material holding means so as to allow the reaction vessel to be filled with a raw material gas for forming said thin film.

19. The apparatus according to claim 13, further comprising a material holding means arranged within the reaction vessel for holding a solid or liquid material, the distances between each of said material holding means and said substrate differing from each other.

20. The apparatus according to claim 19, further comprising a control means for controlling the distances between each of said material holding means and said substrate.

* * * * *